United States Patent
Chen et al.

(10) Patent No.: US 8,466,027 B2
(45) Date of Patent: Jun. 18, 2013

(54) SILICIDE FORMATION AND ASSOCIATED DEVICES

(75) Inventors: Hung-Ming Chen, Hsinchu (TW); Chih-Hao Chang, Chu-Bei (TW); Chih-Hao Yu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 18 days.

(21) Appl. No.: 13/227,979

(22) Filed: Sep. 8, 2011

(65) Prior Publication Data

US 2013/0062669 A1 Mar. 14, 2013

(51) Int. Cl.
*H01L 21/336* (2006.01)

(52) U.S. Cl.
USPC .................... 438/283; 257/E21.442

(58) Field of Classification Search
USPC ........................ 438/283, 976; 257/E21.442
See application file for complete search history.

(56) References Cited

U.S. PATENT DOCUMENTS 7,442,596 B2 * 10/2008 Lee et al. ...................... 438/198
7,528,025 B2 * 5/2009 Brask et al. .................. 438/183

* cited by examiner

*Primary Examiner* — Chandra Chaudhari
(74) *Attorney, Agent, or Firm* — Haynes and Boone, LLP (57) ABSTRACT

Improved silicide formation and associated devices are disclosed. An exemplary method includes providing a semiconductor material having spaced source and drain regions therein, forming a gate structure interposed between the source and drain regions, performing a gate replacement process on the gate structure to form a metal gate electrode therein, forming a hard mask layer over the metal gate electrode, forming silicide layers on the respective source and drain regions in the semiconductor material, removing the hard mask layer to expose the metal gate electrode, and forming source and drain contacts, each source and drain contact being conductively coupled to a respective one of the silicide layers.

9 Claims, 13 Drawing Sheets

FIG. 13

SILICIDE FORMATION AND ASSOCIATED DEVICES

BACKGROUND

The semiconductor integrated circuit (IC) industry has experienced rapid growth. Technological advances in IC materials and design have produced generations of ICs where each new generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component or line that can be created using a fabrication process) has decreased. This scaling-down process generally provides benefits by increasing production efficiency and lowering associated costs. Such scaling down also produces a relatively high power dissipation value, which may be addressed by using low power dissipation devices such as complementary metal-oxide-semiconductor (CMOS) devices.

Due to this scaling down trend, common manufacturing tasks have become more difficult, for instance, due to high aspect ratios. As one example, one approach to improve the electrical connections between source and drain regions and associated source and drain contacts has been to perform a silicidation process on the source and drain regions through the source and drain contact holes before they are filled with contact metal. However, this through-contact-hole silicidation process may be more difficult and less successful when the contact holes have a high aspect ratio. Thus, although these approaches have been satisfactory for their intended purpose, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
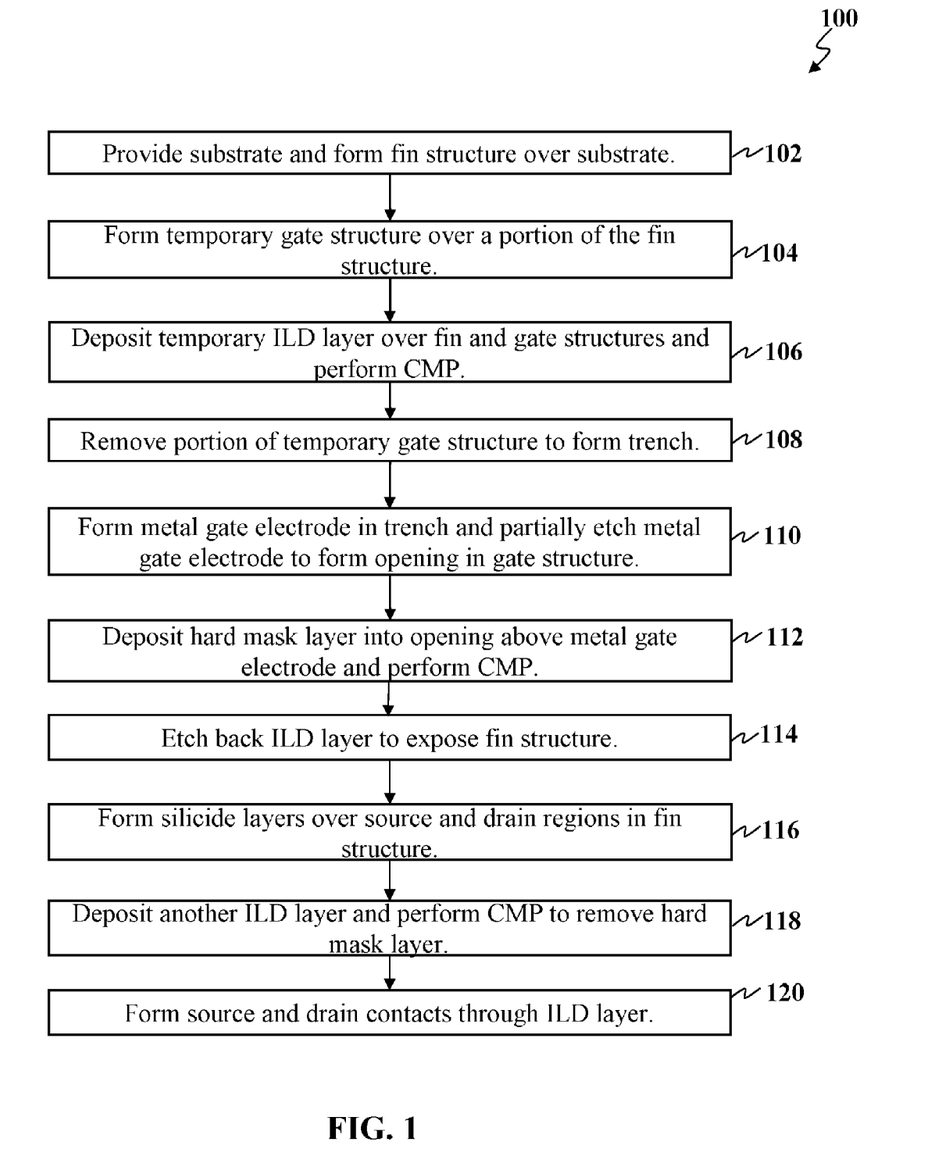
FIG. 1 is a flow chart of a method for fabricating an integrated circuit device according to various aspects of the present disclosure.

FIG. 1 is a flow chart of a method 100 for fabricating an integrated circuit device according to various aspects of the present disclosure. In the present embodiment, the method 100 is for fabricating an integrated circuit device that includes a fin-like field effect transistor (FinFET) device. The method 100 begins at block 102 where a semiconductor substrate is provided and a fin structure is formed over the substrate. Then, at block 104, a temporary gate structure is formed over a portion of the fin structure and spacers are formed on the sidewalls of the temporary gate structure. Also, spaced source and drain regions may be formed in the fin structure at block 104. The method 100 continues with block 106 where a temporary ILD layer is deposited over the fin and temporary gate structures. A chemical-mechanical polishing/planarization (CMP) process is also performed to remove the portion of the temporary ILD layer above the temporary gate structure. Next, in block 108, a portion (i.e. a dummy gate electrode) of the temporary gate structure is removed to form a trench therein. The method continues to block 110 where a metal gate electrode is deposited into the trench and partially etched back to form an opening in the gate structure. Then, in block 112, a hard mask layer is deposited into the opening and over the temporary ILD layer on either side of the gate structure. The portion of the hard mask layer outside of the opening is then removed with a CMP process. At block 114, the temporary ILD layer is removed by an etching process such that the underlying source and drain regions of the fin structure are exposed. The method proceeds to block 116 where silicide layers are formed on source and drain regions of the fin structure on either side of the gate structure. More specifically, a metal layer is deposited on the source and drain regions, the metal layer and substrate are annealed to create the silicide, and any remaining un-reacted metal is removed by an etching process. Next, in block 118, another ILD layer is deposited over the gate structure and substrate, and a CMP process is performed to remove the hard mask layer from above the metal gate electrode and also to planarize the ILD layer. Finally, in block 120, source and drain contacts are formed through the ILD layer such that they are conductively coupled to the silicide layers on the respective source and drain regions.

Additional steps can be provided before, during, and after the method 100, and some of the steps described can be replaced or eliminated for other embodiments of the method. For example, semiconductor material may be epitaxially (epi) grown in the source and drain regions after the dummy gate structure is formed in block 104. The discussion that follows illustrates various embodiments of an integrated circuit device that can be fabricated according to the method 100 of FIG. 1.

Figure 2:
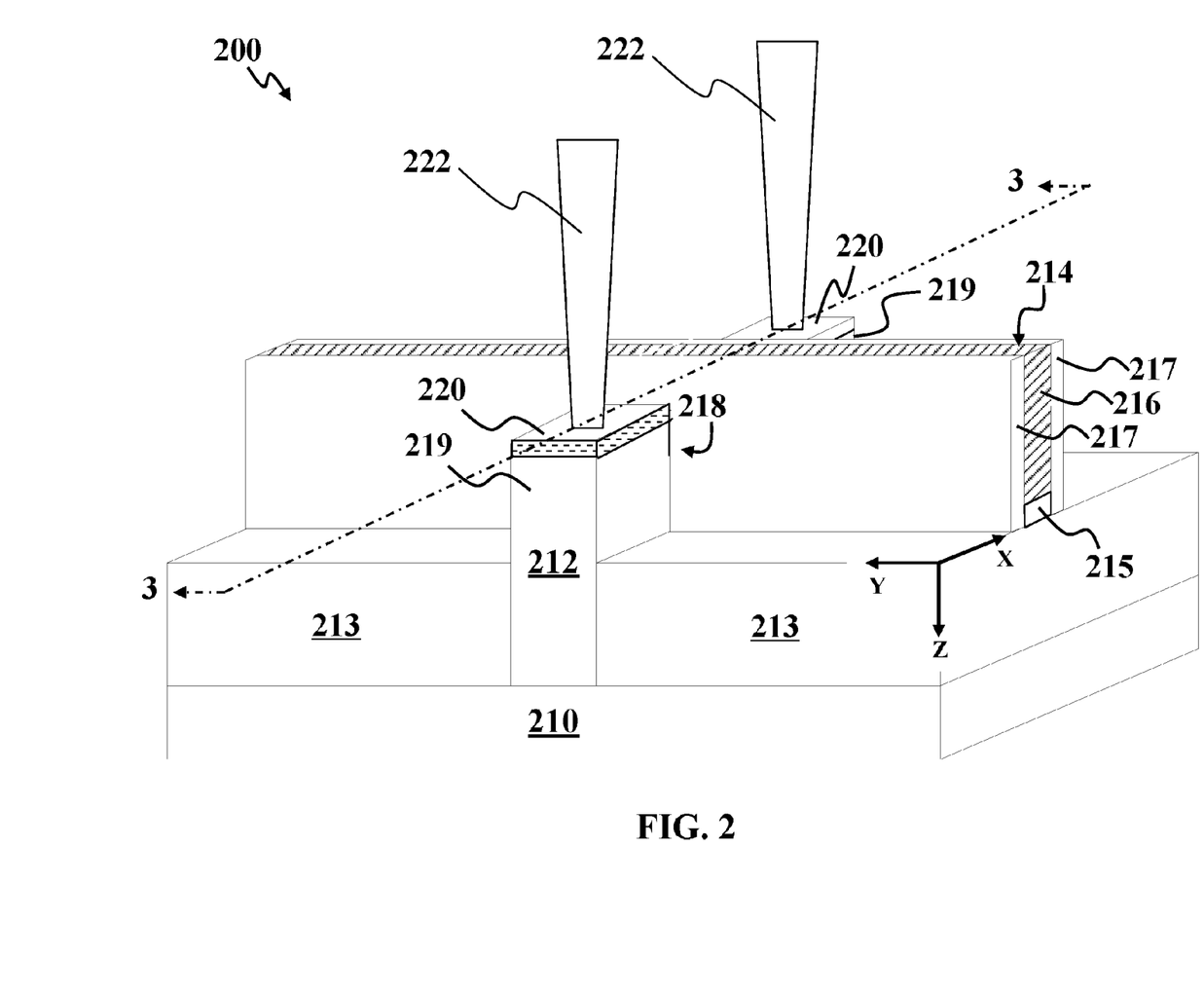
FIG. 2 is a diagrammatic perspective view of a fin-like field effect transistor (FinFET) device according to various aspects of the present disclosure.
Figure 3:
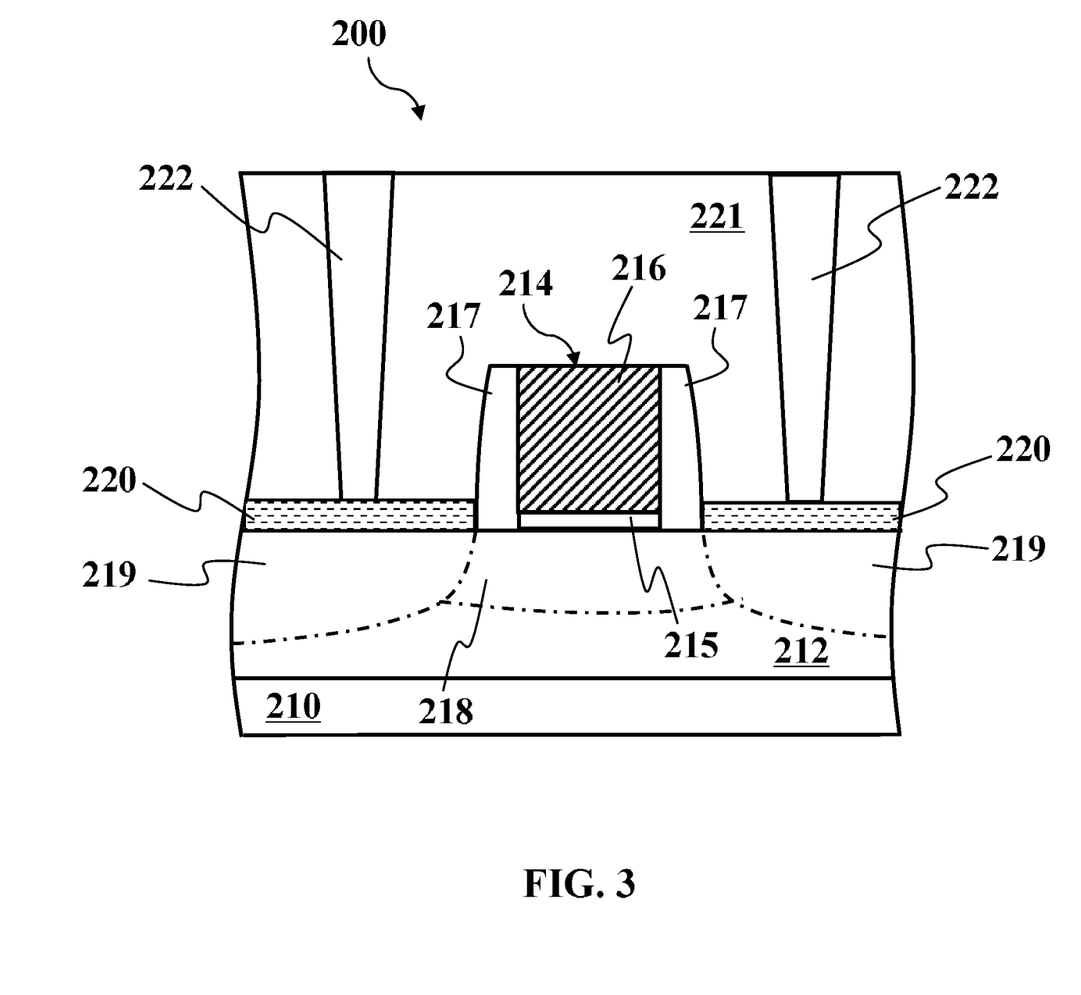
FIG. 3 is a diagrammatic fragmentary sectional view of the FinFET device in FIG. 2 taken along line 3-3.

Referring now to FIGS. 2 and 3, FIG. 2 is a diagrammatic perspective view of a FinFET device 200 according to various aspects of the present disclosure and FIG. 3 is a diagrammatic fragmentary sectional view of the FinFET device 200 taken along line 3-3 in FIG. 2. In the present disclosure, the term FinFET device refers to any fin-based transistor. The FinFET device 200 may be included in a microprocessor, memory cell, and/or other integrated circuit device. FIG. 2 has been simplified for the sake of clarity to better illustrate the inventive concepts of the present disclosure. Additional features may be added in the FinFET device 200, and some of the features described below can be replaced or eliminated in other embodiments of the device 200.

The FinFET device 200 includes a substrate (wafer) 210. The substrate 210 is a bulk silicon substrate. Alternatively, the substrate 210 comprises an elementary semiconductor, such as silicon or germanium in a crystalline structure; a compound semiconductor, such as silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate may be fabricated using separation by implantation of oxygen (SIMOX), wafer bonding, and/or other suitable methods. The substrate 210 may include various doped regions and other suitable features.

The FinFET device 200 includes a fin structure 212, such as a silicon (Si) fin, that extends from the substrate 210. The fin structure 212 is formed by a suitable process, such as a lithography and etching process. For example, the fin structure 212 may be formed by forming a photoresist layer (resist) overlying the substrate, exposing the resist to a pattern, performing a post-exposure bake process, and developing the resist to form a masking element including the resist. The masking element may then be used to etch the fin structure 212 into the silicon substrate 210. The fin structure 212 may be etched using a reactive ion etch (RIE) and/or other suitable process. Alternatively, the fin structure 212 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes.

Isolation features 213, such as shallow trench isolation (STI) structures, surround the fin structure 212 and isolate the fin structure 212 from other not-illustrated fins of the FinFET device 200. The isolation features 213 may be formed by partially filling trenches surrounding the fin structure 212 (formed after etching the substrate 210 to form the fin structure 212) with an insulating material, such as silicon oxide, silicon nitride, silicon oxynitride, other suitable material, or combinations thereof. The filled trench may have a multi-layer structure, for example, a thermal oxide liner layer with silicon nitride filling the trench.

The FinFET device 200 includes a gate structure 214. The gate structure 214 traverses the fin structure 212, and in the depicted embodiment, is formed on a central portion of the fin structure 212. The gate structure 214 engages three surfaces of the fin structures 212—the top surface and two adjacent side surfaces. The gate structure 214 includes a gate dielectric layer 215 and a metal gate electrode 216 in addition to other layers. In the illustrated embodiment, the gate dielectric layer 215 includes a high-k dielectric material, but alternatively may include other suitable dielectric material, such as silicon oxide or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The metal gate electrode includes a metal such as Al, Cu, Ti, Ta, W, Mo, TaN, NiSi, CoSi, TiN, WN, TiAl, TiAlN, TaCN, TaC, TaSiN, other conductive materials, or combinations thereof. The metal gate electrode 216 may be formed using a gate last process as will be described below. In some embodiments, the gate structure 214 may include numerous other layers, for example, capping layers, interface layers, diffusion layers, barrier layers, strain-inducing layers, or combinations thereof.

As will be described below, the gate structure 214 is formed by a suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

Spacers 217 are formed on the gate structure 214 as illustrated in FIGS. 2 and 3. The spacers 217 are disposed on sidewalls of the gate structure 214, and may be considered part of the gate structure. The spacers 217 are formed by a suitable process to a suitable thickness. For example, a dielectric layer, such as a silicon oxide layer, is blanket deposited over the FinFET device 200; and then, the silicon oxide layer is etched to remove the silicon oxide layer to form spacers 217. Alternatively, the spacers 217 include another dielectric material, such as silicon nitride, silicon oxynitride, or combinations thereof.

The fin structure 212 includes a channel region 218 in those portions nearest to the gate structure 214. The fin structure 212 further includes doped source and drain (S/D) regions 219 on either side of the channel region 218. These source and drain regions are doped regions having a dopant implanted therein that is appropriate for the design requirements of the FinFET device 200. In those embodiments in which FinFET device 200 is an NMOS device, source and drain regions 219 are doped with an n-type dopant such as phosphorus or arsenic, or combinations thereof, and in those embodiments in which FinFET device 200 is a PMOS device, source and drain regions 219 are doped with an p-type dopant such as boron or BF2 or combinations thereof. The source and drain regions 219 include silicide layers 220 disposed in the top portions of the fin structure 212. As shown in FIGS. 2 and 3, the silicide layers 220 extend from the gate structure 214 outwardly across approximately the entirety of the top portions of the fin structure 212. In the current embodiment, the silicide layers 220 are nickel silicide (NiSi) layers, but in alternative embodiments, the silicide layers may include another type of metal. Further, in some embodiments, the source and drain regions 219 may include epitaxial (epi) growths in or near the silicide layers 220 to strain the channel region 218.

As shown in FIG. 3, the fin structure 212 and gate structure 214 of FinFET device 200 are surrounded by an inter-level dielectric (ILD) layer 221. For the sake of clarity, device 200 is depicted in FIG. 2 without ILD 221. The FinFET device 200 includes source and drain contacts 222 (M0) that extend down through the ILD layer 221 and engage respective silicide layers 220 over the source and drain regions 219. The source and drain contacts 222 electrically couple the source and drain regions 219 of the FinFET device 200 to metallization layers and other semiconductor devices. In the illustrated embodiment, the source and drain contacts 222 are formed of tungsten, but, in alternative embodiments, they may be formed of another conductor such as copper or aluminum.

FIGS. 4-12 are diagrammatic fragmentary sectional views similar to FIG. 3 but showing the FinFET device 200 during various stages of manufacture. The stages of manufacture depicted in FIGS. 4-12 correspond with fabrication of the device 200 using a CMOS technology process flow. It should be understood that additional processes may be provided before, during, and/or after the stages illustrated in FIGS. 4-12, and that some selected processes may only be briefly described if they are well known in the art.

Figure 4:
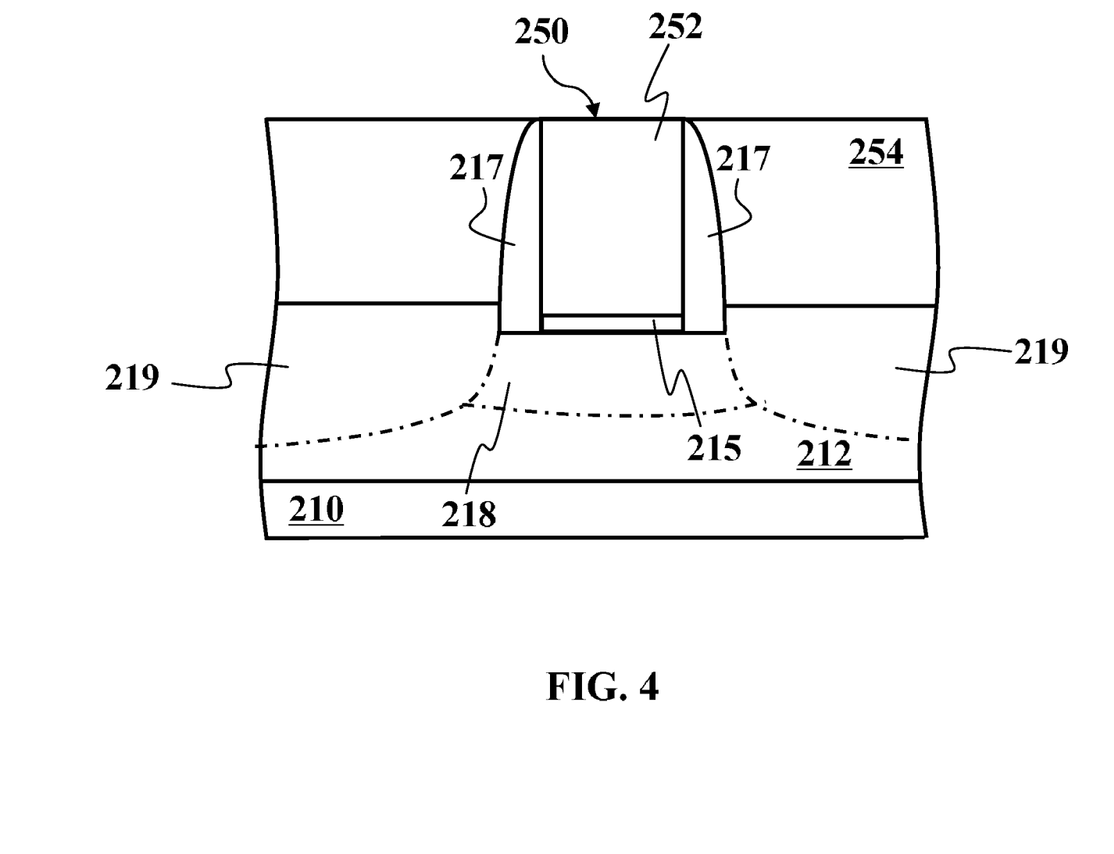
FIGS. 4-12 are diagrammatic fragmentary sectional views similar to FIG. 3 but showing the FinFET device of FIG. 2 during various stages of manufacture.

Referring to FIG. 4, the FinFET device 200 is shown in a partially completed state and has undergone previous manufacturing steps. In the illustrated embodiment, the FinFET device 200 has undergone processes described above to form the fin structure 212 including the source and drain regions 219 and a temporary gate structure 250. The temporary gate structure 250 includes the gate dielectric layer 215 and a dummy polysilicon layer 252 (dummy gate electrode) surrounded by the spacers 217. The gate dielectric layer 215 and dummy polysilicon layer 252 may be formed using any suitable process, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. In some embodiments, additional layers such as capping layers, interface layers, diffusion layers, barrier layers, and strain-inducing layers may be deposited to form a portion of the temporary gate structure 250.

Further, in some embodiments, epitaxial growths are grown on fin structure 212 on opposite sides of the temporary gate structure 250. In such a case, the channel region 218 is disposed between epitaxial growths and, as the epitaxial growths are grown, strain may be induced in the channel region due to lattice mismatch. In those embodiments in which FinFET device 200 is an NMOS device, the epi growths may be silicon or silicon carbon (Si:C) and may be doped with n-type dopants, such as phosphorous or arsenic, to form the source and drain regions. In those embodiments in which FinFET device 200 is a PMOS device, the epi growths may be silicon germanium (SiGe) and may be doped with a p-type dopant such as boron to form the source and drain regions. Additionally, as shown in FIG. 4, a temporary ILD layer 254 has been deposited over the fin structure 212 and temporary gate structure 250, and a CMP process has been completed to planarize the ILD layer 254 such that it is co-planar with the top of the temporary gate structure.

Figure 5:
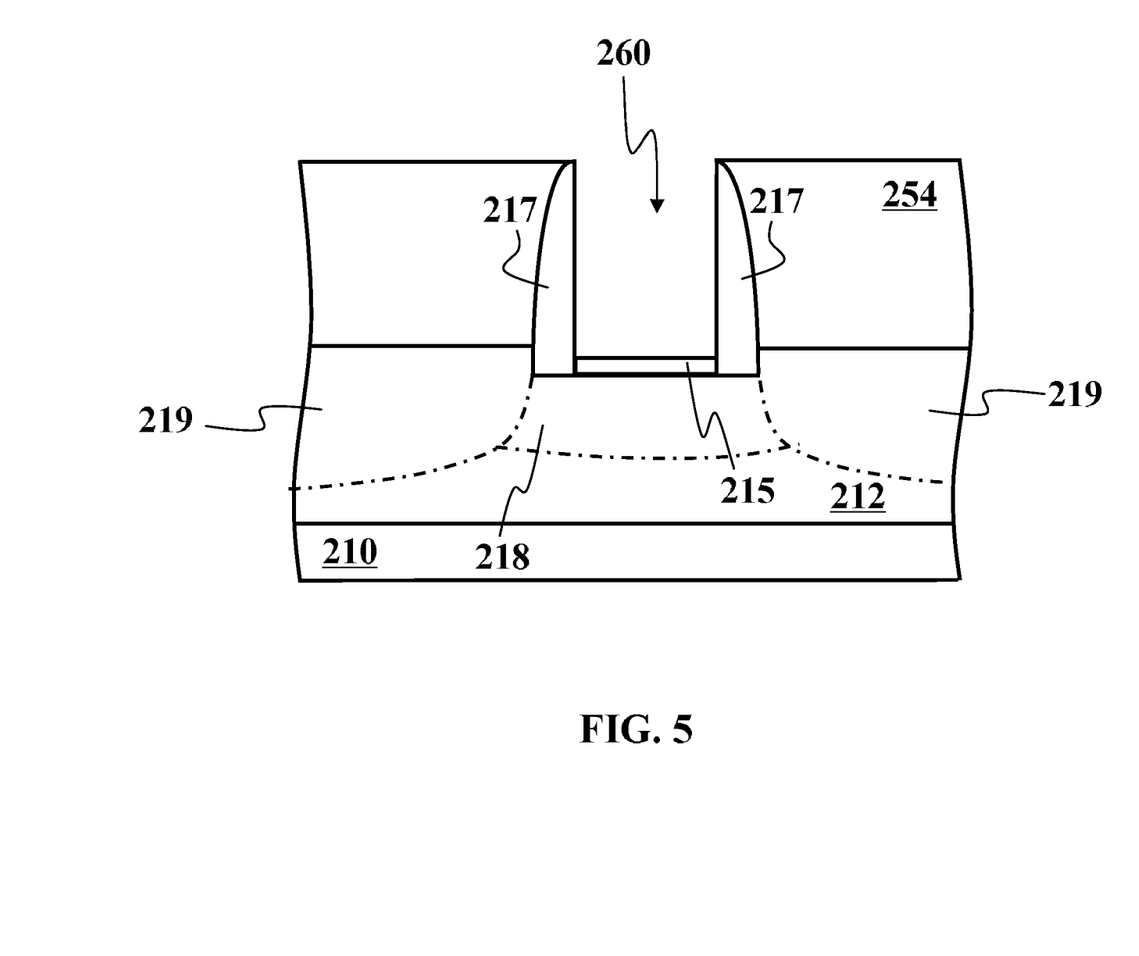
Figure 6:
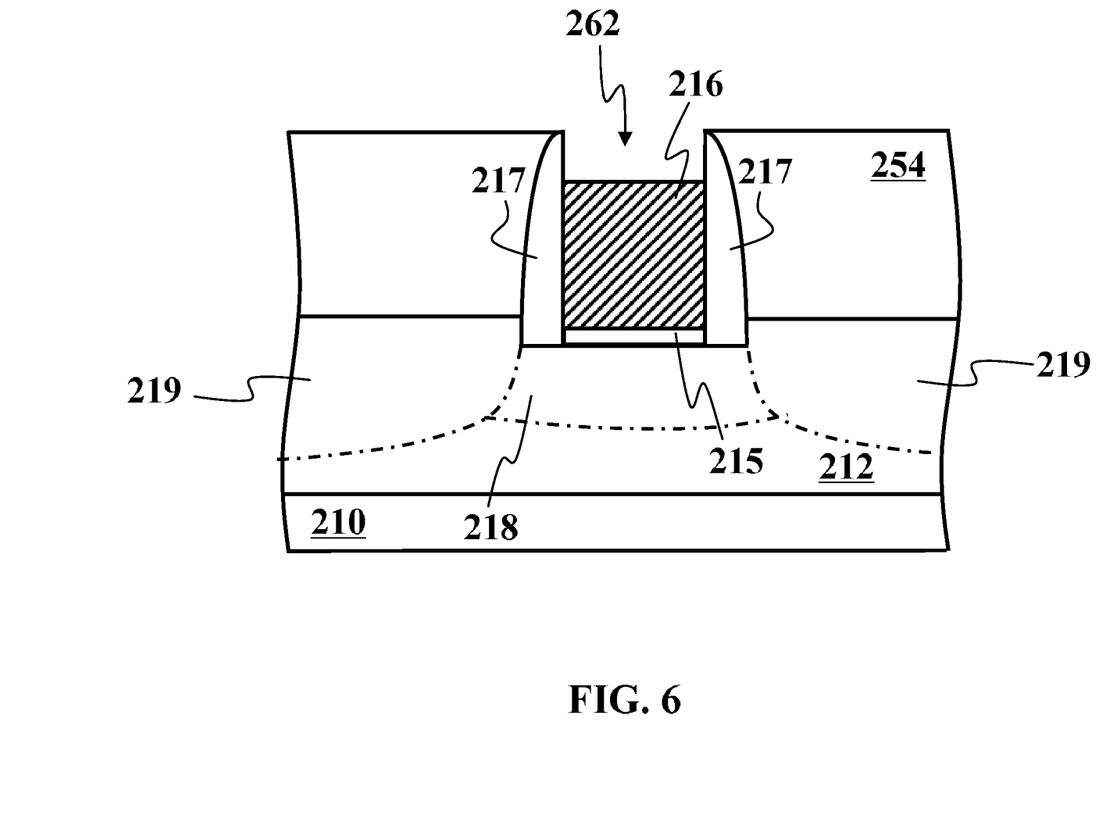

Referring now to FIGS. 5 and 6, a gate replacement process is performed, wherein the top layer of the temporary gate structure 250 is removed and replaced with a metal gate electrode. In particular, FIG. 5 illustrates the temporary gate structure 250 after removal of the dummy polysilicon layer 252 (dummy gate electrode). The dummy polysilicon layer 252 may be removed from the temporary gate structure 250 by any suitable process, such as a dry etching and/or wet etching process. After etching away the layer 250, the top of the gate dielectric layer 215 and the inner surfaces of spacers 270 respectively define bottom and side surfaces of a trench 260. Next, as shown in FIG. 6, trench 260 is completely filled (not shown) with a metal fill layer to form the metal gate electrode 216. The metal gate electrode 216 is formed by the deposition of aluminum or other conductive metal such as copper, tungsten, or titanium. In some embodiments, filling the trench 260 includes depositing a work function layer prior to depositing a metal fill layer. Next, after the trench 260 has been completely filled with a metal fill layer, an etching process is performed to remove a portion of the metal gate electrode 216. In the illustrated embodiment, approximately 5-10 nanometers (nm) from the top portion of the metal gate electrode 216 is etched away to form an opening 262 approximately 5-10 nm deep. In alternative embodiments, more or less of the metal gate electrode may be etched away.

Figure 7:
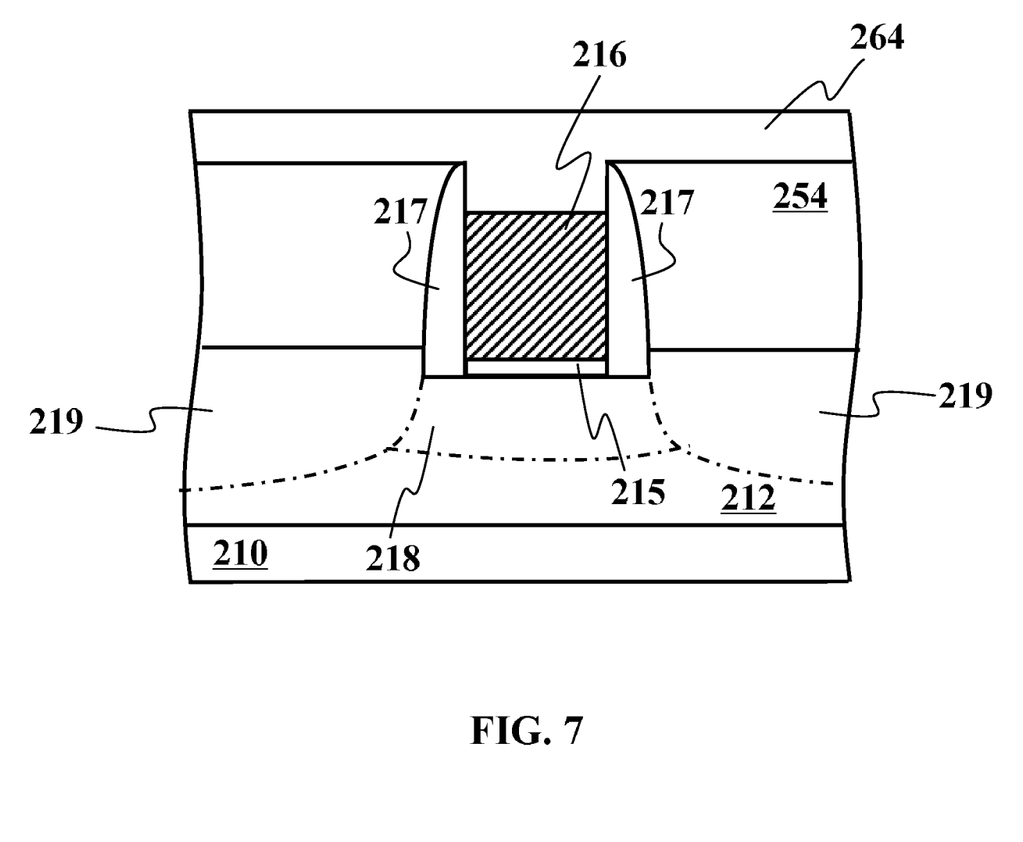
Figure 8:
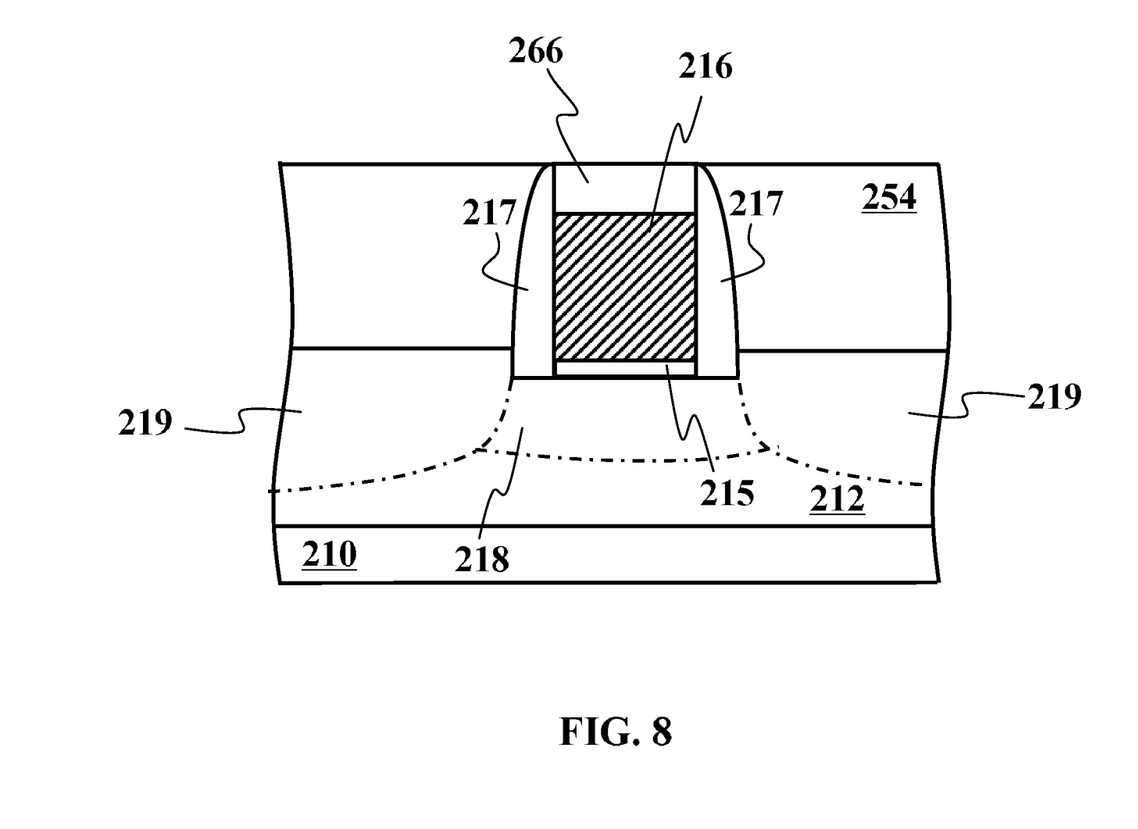

Referring now to FIGS. 7 and 8, a hard mask is deposited over the gate structure to protect the metal gate electrode 216. Specifically, as shown in FIG. 7, a hard mask material layer 264 is deposited into the opening 262 and over the temporary ILD layer 254. In the current embodiment, the hard mask material is silicon nitride (SiN), but, in alternative embodiments, the hard mask material may be silicon carbon (SiC), silicon oxynitride (SiON) or other suitable material. Next, as shown in FIG. 8, a CMP process is performed to remove portions of the hard mask material layer 264 outside of the opening 262. After the CMP process is performed, a hard mask cap 266 (i.e. a portion of the hard mask layer 264) remains over the metal gate electrode 216 and between the spacers 217. The hard mask cap 266 protects the metal gate electrode 216 from subsequent processes.

Figure 9:
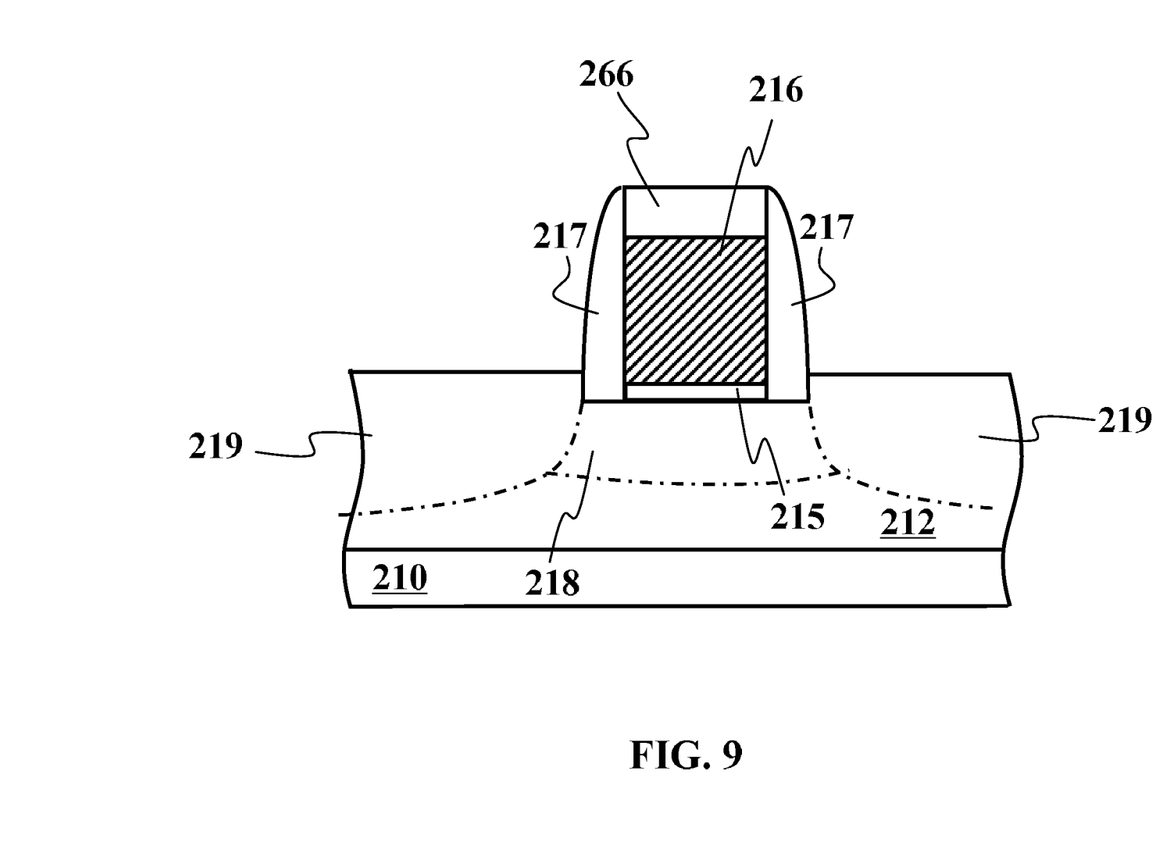
Figure 10:
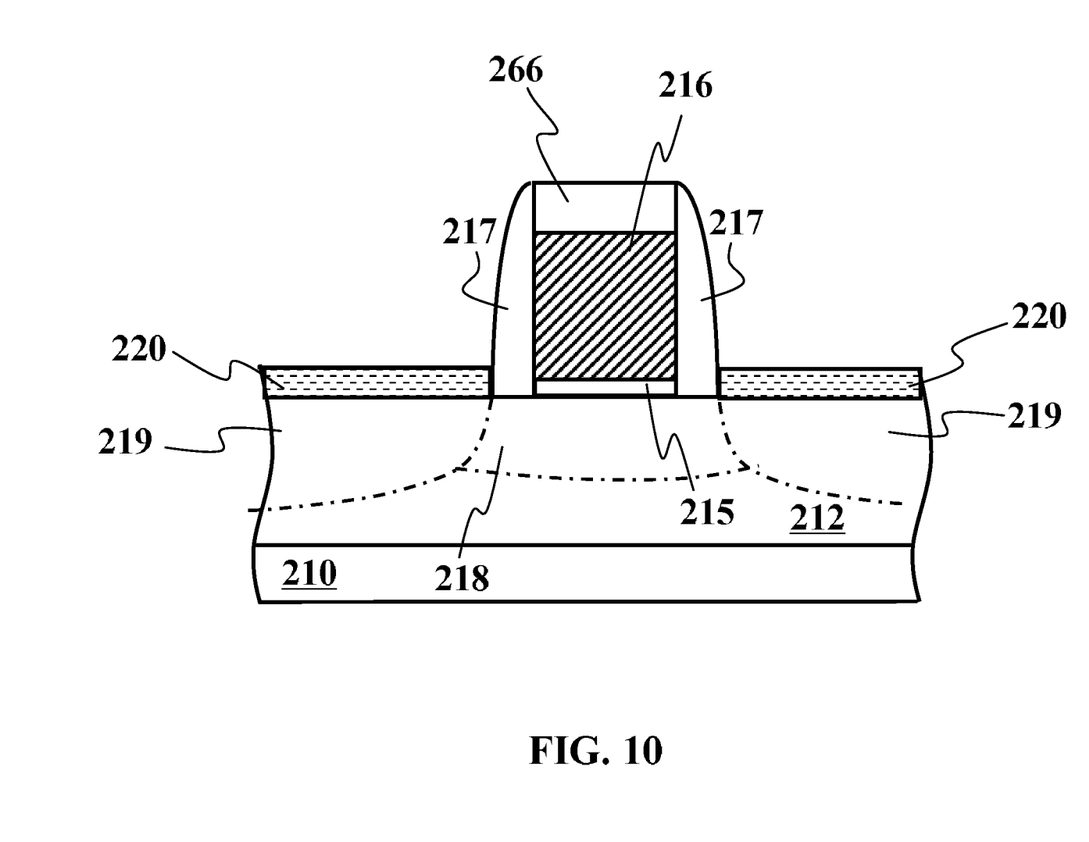

Referring now to FIG. 9, the temporary ILD layer 254 is etched away such that the source and drain regions 219 in the fin structure 212 are exposed. The metal gate electrode 216 remains intact due to the protection of the hard mask cap 266. Next, in FIG. 10, a silicidation process is performed on the FinFET device 200. Specifically, a silicidation process such as a self-aligned silicide (salicide) process is performed to grow a silicide layer on any exposed silicon-based surface. Specifically, a metal material such as nickel (Ni) is deposited over at least the fin structure 212, the temperature is raised to cause a reaction between the nickel and any silicon exposed to the nickel, and then any un-reacted nickel is etched away. During silicidation, silicide layers 220 are formed in the source and drain regions 219. Because the entire source and drain regions are exposed during the silicidation process, the silicide layers 220 form across approximately the entire length of the regions including in those portions of the source and drain approximately adjacent the channel region 218. Hard mask cap 266 remains on metal gate electrode 216 during silicidation to prevent damage. In alternative embodiments, other metals besides nickel may be used in the silicidation process.

Figure 11:
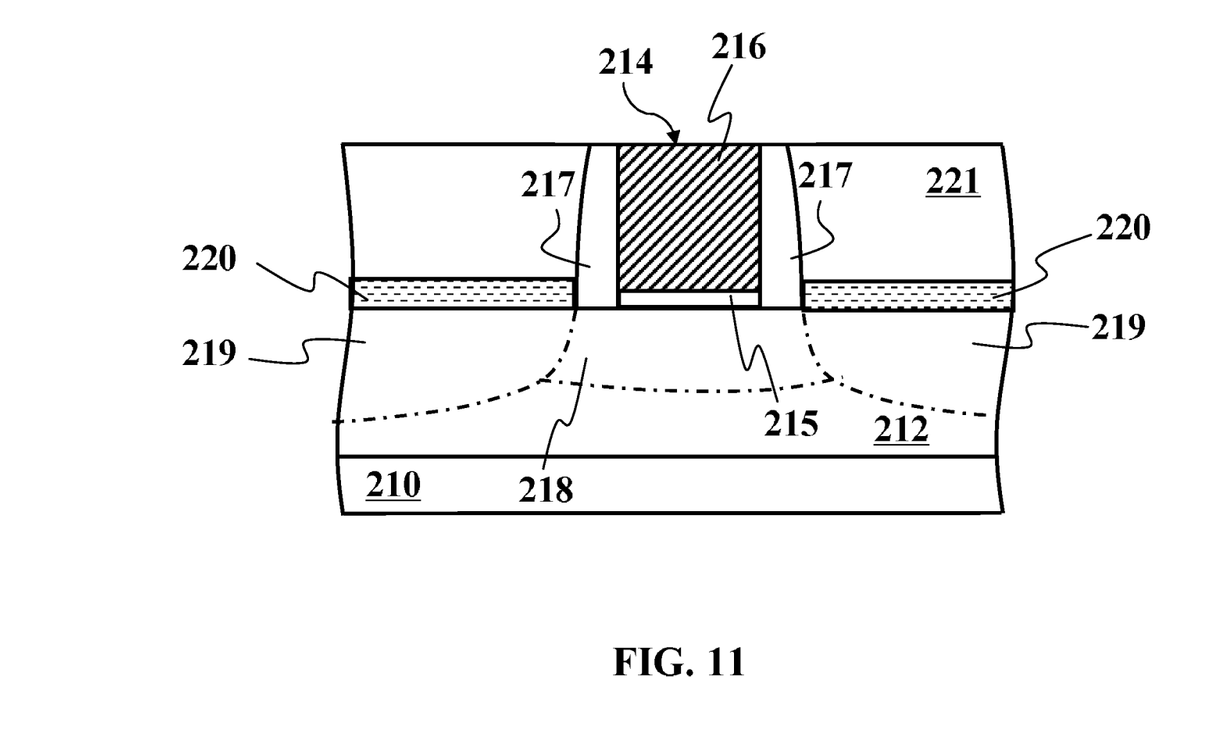
Figure 12:
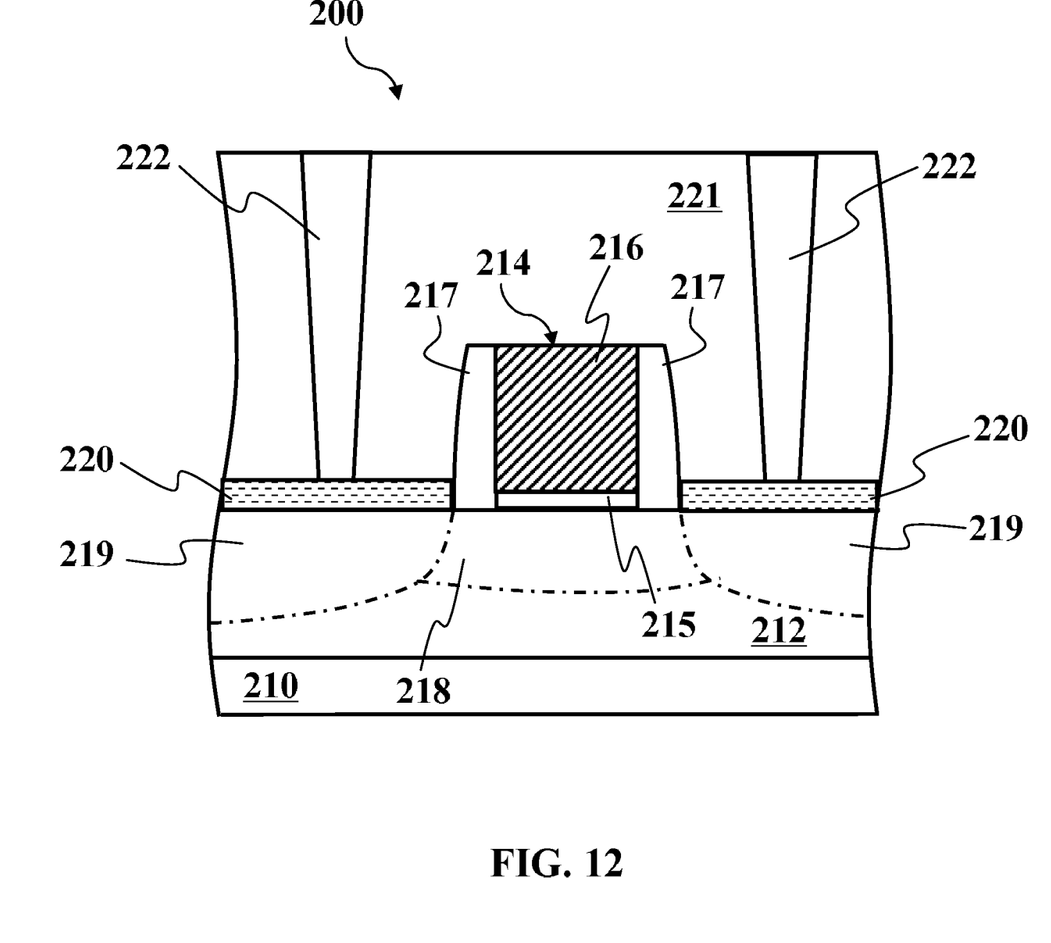

Referring now to FIG. 11, the gate structure 214 is finalized. First, the ILD layer 221 is deposited over the fin structure 212 and the hard mask cap 266. Then, a CMP process is performed to planarize the ILD layer 221 with the top of the metal gate electrode 216. Specifically, during the CMP process, the hard mask cap 266 is removed along with top portions of the spacers 217. Finally, in FIG. 12, the ILD layer 221 is augmented with additional dielectric material and the source and drain contacts 222 are formed therethrough. In more detail, after the ILD layer 221 is augmented, contact holes are etched through the ILD layer down to the silicide layers 220. In the illustrated embodiment, the contact holes have high aspect ratios (a ratio of depth over width). In some embodiments, the aspect ratios of the contact holes may be higher than approximately 3, but, in other embodiments, may be between approximately 1 and 3. Metal such as tungsten is then deposited into the contact holes down to the silicide layers 220 to form the source and drain contacts 222. When formed, the source and drain contacts 222 are conductively coupled to the silicide layers 220. As compared with previous designs in which silicidation of source and drain regions is performed through the high-aspect contact holes, the source and drain contacts 222 in the device 200 may make a better electrical connection with the source and drain regions 219. During operation, when the FinFET device is switched "on" via the gate structure 214, current may flow down the source contact 222, through the channel region 218, and then up the drain contact. Notably, the current may flow horizontally through the silicide layers 220 when flowing between the source and drain contacts 222 and the channel region 218 without flowing through the more resistive portions of the source and drain regions 219 below the silicide layers. In this manner, operating resistance in the FinFET device 200 may be reduced as compared to previous designs that employ through-contact-hole silicidation processes.

It is understood that the FinFET device 200 may undergo further processing to complete fabrication. For example, a not-illustrated multilayer interconnection (MLI) including metal layers (e.g., M1, M2, etc.) and inter-metal dielectric (IMD) may be formed above fin and gate structures 212 and 214 in order to electrically couple various device parts to form an integrated circuit. The multilayer interconnection includes vertical interconnects, such as conventional vias or contacts, and horizontal interconnects, such as metal lines. The various interconnection features may utilize various conductive materials including copper, tungsten and silicide. In one example, a damascene process is used to form copper multilayer interconnection structure.

Figure 13:
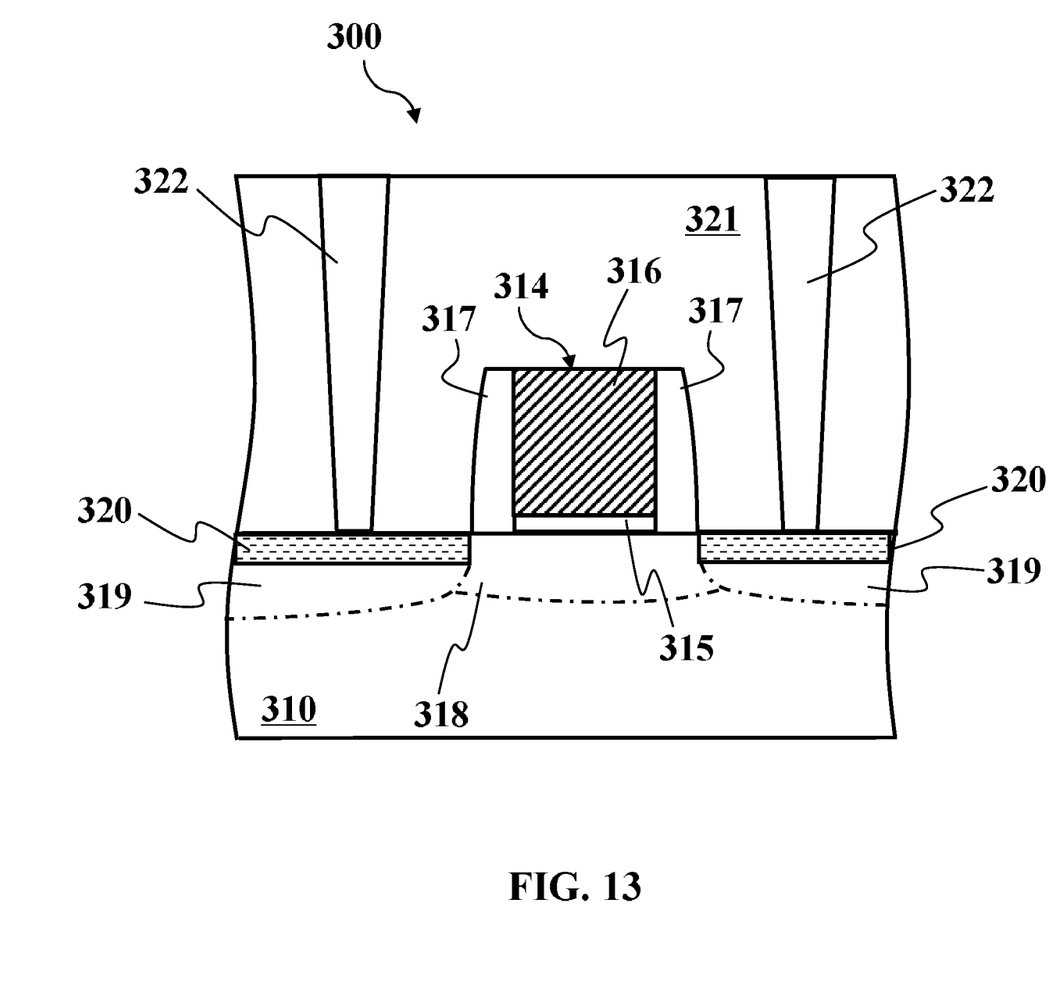
FIG. 13 is a diagrammatic fragmentary sectional view of a FET device according to another embodiment of the present disclosure.

FIG. 13 is a diagrammatic fragmentary sectional view of a FET device 300 according to another embodiment of the present disclosure. The FET device 300 is similar to the FinFET device 200 in that it includes a semiconductor substrate 310 and a gate structure 314; however, in FET device 300, the gate structure 314 is disposed on the semiconductor substrate instead of a fin structure extending out of the substrate. The gate structure 314 of the FET device 300 is also similar to the gate structure in the FinFET device 200 in that it includes a high-k gate dielectric layer 315, metal gate electrode 316, and spacers 317. Further, in FET device 300, a channel region is disposed in the substrate 310 and is interposed between source and drain regions 319. In some embodiments, the source and drain regions 319 may include epitaxial growths formed of a material suitable to strain the channel region 318. As in the FinFET device 200, silicide layers 320 are disposed in the source and drain regions 319 and extend outwardly from the gate structure 314 along approximately the entirety of each of the respective source and drain regions. Further, an ILD layer 321 is disposed over the gate structure and semiconductor substrate 310, and source and drain contacts 322 extend through the ILD layer 321 and conductively engage a respective one of the silicide layers 320. Finally, features in the FET device 300 that are similar to features in the FinFET device 300 (e.g. silicide layers, gate structure, source and drain contacts, etc) may be formed by a process similar to the process depicted in FIGS. 4-12.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduce herein. For example, even though the illustrated embodiment featured a FinFET device, the concepts outlined above may be applied to other semiconductor devices. For instance, one of ordinary skill in the art would appreciate that the process outlined in FIGS. 4-12 may be applied to a standard CMOS transistor without fin-like features, such as FET device 300 in FIG. 13, to achieve the result of improved electrical connection to other integrated circuit features. In such a scenario, source and drain regions may be formed in a planar semiconductor substrate having with a gate structure formed on the substrate between the source and drain regions. Further, in some embodiments, the above process may be slightly altered to apply to two adjacent complementary FinFET devices, for instance, a NMOS FinFET and a PMOS FinFET. In such a case, each FinFET may be filled with an appropriate type of metal (n-metal or p-metal) and etched back partially as shown in FIG. 6. The remaining process shown in FIGS. 7-12 may then be applied to each complementary FinFET. Those skilled in the art should also realize that such equivalent constructions do not depart from the spirit and scope of the present disclosure, and that they may make various changes, substitutions, and alterations herein without departing from the spirit and scope of the present disclosure.

The present disclosure provides for many different embodiments. Different embodiments may have different advantages, and no particular advantage is necessarily required of any embodiment. In an example, a method includes providing a semiconductor material having spaced source and drain regions therein; forming a gate structure interposed between the source and drain regions; performing a gate replacement process on the gate structure to form a metal gate electrode therein; forming a hard mask layer over the metal gate electrode; forming silicide layers on the respective source and drain regions in the semiconductor material; removing the hard mask layer to expose the metal gate electrode; and forming source and drain contacts, each source and drain contact being conductively coupled to a respective one of the silicide layers.

In an example, the method may additionally include depositing a first inter-level dielectric (ILD) layer over the gate structure and semiconductor material before performing the gate replacement process; and removing the first ILD layer before forming the silicide layers. Also, the method may include depositing a second ILD layer over the silicide layers and the hard mask layer; and performing a chemical-mechanical polishing (CMP) process to planarize the second ILD layer. The performing the CMP process may include the removing the hard mask layer. The method may additionally include removing a top portion of the metal gate electrode to form an opening in the gate structure and the forming the hard mask layer may include forming the hard mask layer inside of the opening. The removing the top portion of the metal gate electrode may include removing a portion of the metal gate electrode having a thickness in the range of approximately 5 to 10 nanometers. The forming the silicide layers may include forming the silicide layers such that they extend outwardly from the gate structure along approximately the entirety of each of the respective source and drain regions. Forming the gate structure may include forming spacers on the sidewalls of the gate structure, and removing the hard mask layer may include removing portions of the spacers surrounding the hard mask layer.

In another example, a method includes providing a semiconductor substrate; forming a fin structure extending upwardly from the substrate, the fin structure having spaced source and drain regions therein; forming a gate structure engaging the fin structure between the source and drain regions, the gate structure having a dummy gate electrode therein; depositing a first inter-level dielectric (ILD) layer over the gate structure and fin structure; removing the dummy gate electrode to form a trench in the gate structure; depositing a metal layer into the trench to form a metal gate electrode therein; removing a top portion of the metal gate electrode to form an opening in the gate structure; forming a hard mask layer in the opening; removing the first ILD layer to expose the source and drain regions in the fin structure; forming silicide layers on the respective source and drain regions in the fin structure; removing the hard mask layer; and forming source and drain contacts, each source and drain contact being conductively coupled to a respective one of the silicide layers. The method may include depositing a second ILD layer over the silicide layers and the hard mask layer, and performing a chemical-mechanical polishing (CMP) process to planarize the second ILD layer. The performing the CMP process may include the removing the hard mask layer. The removing the top portion of the metal gate electrode may include removing a portion of the metal gate electrode having a thickness in the range of approximately 5 to 10 nanometers. The method may also include forming epitaxial growths in the source and drain regions after forming the gate structure. Forming the gate structure may include forming spacers on sidewalls of the gate structure, the spacers partially defining the opening after the removing the top portion of the metal gate electrode. The removing the hard mask layer may include removing portions of the spacers surrounding the hard mask layer. The forming the silicide layers may include forming the silicide layers such that they extend outwardly from the gate structure along approximately the entirety of each of the respective source and drain regions.

In yet another example, a semiconductor device includes a semiconductor substrate; a fin structure disposed over the semiconductor substrate and having spaced source and drain regions extending outwardly from a channel region defined between the source and drain regions; a gate structure disposed on a portion of the fin structure, the gate structure engaging the fin structure adjacent to the channel region and between the source region and the drain region; a first silicide layer disposed on the fin structure, the first silicide layer extending outwardly from the gate structure along a top portion of the source region; a second silicide layer disposed on the fin structure, the second silicide layer extending outwardly from the gate structure along a top portion of the drain region; a source contact conductively coupled to the first silicide layer and configured to transfer current to the source region; and a drain contact conductively coupled to the second silicide layer and configured to transfer current away from the drain region. The device may include epitaxial growths in the source and drain regions of the fin structure on each side of the gate structure, the epitaxial growths imparting tensile strain to the channel region. Also the device may include spacers disposed on sidewalls of the gate structure and traversing the fin structure, the spacers being interposed between sidewalls and the first and second silicide layers. The may additionally include an ILD layer disposed over the fin and gate structures, the source and drain contacts extending through respective contact holes in the ILD layer, and the contact holes having high aspect ratios.

What is claimed is:

1. A method comprising:
providing a semiconductor substrate;
forming a fin structure extending upwardly from the substrate, the fin structure having spaced source and drain regions therein;
forming a gate structure engaging the fin structure between the source and drain regions, the gate structure having a dummy gate electrode therein;
depositing a first inter-level dielectric (ILD) layer over the gate structure and fin structure;
removing the dummy gate electrode to form a trench in the gate structure;
depositing a metal layer into the trench to form a metal gate electrode therein;
removing a top portion of the metal gate electrode to form an opening in the gate structure;
forming a hard mask layer in the opening;
removing the first ILD layer to expose the source and drain regions in the fin structure;
forming silicide layers on the respective source and drain regions in the fin structure;
removing the hard mask layer; and
forming source and drain contacts, each source and drain contact being conductively coupled to a respective one of the silicide layers.

2. The method of claim 1, further including:
depositing a second ILD layer over the silicide layers and the hard mask layer; and
performing a chemical-mechanical polishing (CMP) process to planarize the second ILD layer.

3. The method of claim 2, wherein the performing the CMP process includes the removing the hard mask layer.

4. The method of claim 1, wherein the removing the top portion of the metal gate electrode includes removing a portion of the metal gate electrode having a thickness in the range of approximately 5 to 10 nanometers.

5. The method of claim 1, including forming epitaxial growths in the source and drain regions after forming the gate structure.

6. The method of claim 1, wherein forming the gate structure includes forming spacers on sidewalls of the gate structure, the spacers partially defining the opening after the removing the top portion of the metal gate electrode.

7. The method of claim 6, wherein the removing the hard mask layer includes removing portions of the spacers surrounding the hard mask layer.

8. The method of claim 1, wherein the forming the silicide layers includes forming the silicide layers such that they extend outwardly from the gate structure along approximately the entirety of each of the respective source and drain regions.

9. A method comprising:
providing a semiconductor substrate;
forming a fin structure extending upwardly from the substrate;
forming a gate structure engaging the fin structure, the gate structure having a dummy gate electrode therein;
depositing a first inter-level dielectric (ILD) layer over the gate structure and fin structure;
removing the dummy gate electrode to form a trench in the gate structure;
depositing a metal layer into the trench to form a metal gate electrode therein;
removing a top portion of the metal gate electrode to form an opening in the gate structure;
forming a hard mask layer in the opening;

removing the first ILD layer to expose source and drain regions;

forming silicide layers on the respective source and drain regions;

removing the hard mask layer; and forming source and drain contacts, each source and drain contact being conductively coupled to a respective one of the silicide layers.

\* \* \* \* \*